United States Patent [19]

Mohan Rao

[11] Patent Number: 5,581,513
[45] Date of Patent: Dec. 3, 1996

[54] CONTINUOUS PAGE RANDOM ACCESS MEMORY AND SYSTEMS AND METHODS USING THE SAME

[75] Inventor: G. R. Mohan Rao, Dallas, Tex.

[73] Assignee: Cirrus Logic, Inc., Fremont, Calif.

[21] Appl. No.: 423,825

[22] Filed: Apr. 19, 1995

[51] Int. Cl.[6] ............................................ G11C 7/00
[52] U.S. Cl. ........................ 365/238.5; 365/189.01; 365/49
[58] Field of Search ........................ 365/238.5, 235, 365/189.01, 49, 219, 220

[56] References Cited

U.S. PATENT DOCUMENTS

| | | | |
|---|---|---|---|
| 4,186,440 | 1/1980 | Miller et al. | 365/232 |
| 4,635,232 | 1/1987 | Iwahashi et al. | 365/200 |
| 5,245,585 | 9/1993 | Voss | 365/238.5 |
| 5,402,377 | 3/1995 | Ohhata et al. | 365/200 |
| 5,473,566 | 12/1995 | Rao | 365/238.5 |

Primary Examiner—Tan T. Nguyen
Attorney, Agent, or Firm—Winstead Sechrest & Minick, P.C.

[57] ABSTRACT

A random access memory 200 is provided which includes input/output circuitry 205 and an array 202 of random access memory cells 201 arranged in rows and columns. Row decoder circuitry 206 is provided for selecting in response to a row address a row of cells in array 202 for access. Column control circuitry 207, 208 is included for controlling access to locations along the selected row, each location comprising at least one memory cell 201. The column control circuitry 207, 208 is operable to sequentially access a first plurality of locations along the selected row through input/output circuitry 205 and simultaneously access a second plurality of locations along the selected row. Auxiliary memory circuitry 209 is included for interfacing exchanges of data between the second plurality of locations and input/output circuitry 205, auxiliary memory circuitry 209 exchanging words with corresponding ones of the second plurality of locations in array 202 in parallel and with input/output circuitry 205 in serial.

21 Claims, 1 Drawing Sheet

CONTINUOUS PAGE RANDOM ACCESS MEMORY AND SYSTEMS AND METHODS USING THE SAME

TECHNICAL FIELD OF THE INVENTION

The present invention relates in general to random access memory devices and in particular to a continuous page random access memory and systems and methods using the same.

BACKGROUND OF THE INVENTION

Presently available dynamic random access memory devices (DRAMs), and their derivatives such as video RAMs (VRAMs), cache DRAMs and window RAMs, are typically designed around a well-established architecture. In the basic architecture, the memory cells are arranged as a rectangular array of m number of rows and n number of columns, with each row associated with a conductive rowline (wordline) and each column associated with a conductive column line (bitline). Row decoder circuitry, including a row address decoder, is coupled to the wordlines and charges the wordline of an addressed row to allow access to the cells of that row. Sense amplifiers are coupled to each of the bitlines for reading, writing and refreshing the data in the cells along the addressed row. Column decoder circuitry is then coupled to the sense amplifiers to allow reading and writing of data into a specific cell or cells (a "location") along the addressed row in response to a column address.

The traditional DRAM is controlled by a number of conventional control signals. In addition power and ground inputs, the typical DRAM includes a random data port of a selected bit-width, a multiplexed address port of a bit-width appropriate to the size of the array, inputs for receiving row address and column address strobes (RAS and CAS) and inputs for receiving read/write (R/W) and output enable (OE) control signals. Normally, to access (read from or write to) a location in the array, a row address in first presented to the address port and latched in with RAS. Once the row address is latched in, a column address is presented at the data port and latched in with CAS. Some predetermined time after receipt of the column address, access is gained to the addressed location through the data port. The read/write control signal determines if data is being read out or written in to the addressed location. The output enable control signal enables the output buffers to drive the data port during a read.

To accommodate all the required addresses, control signals and data inputs and outputs, corresponding number of pins are required for the DRAM packaging. For example, the package for the typically 1 megabit by 16 DRAM (i.e., each location has 16 cells which are accessed per column address) requires 16 input port pins, 12 address port pins, 1 or 2 ground pins, 1 or 2 power pins, and 1 pin each for RAS, CAS, R/W and OE, for a total of 34 or 36 pins. Some DRAM devices, such as those having a CAS split into upper and lower bytes, may include up to 38 pins for the same size (1 megabit by 16) memory. Most DRAM packages are standardized and have either 40, 42, 44, 48, or 64 pins. Thus, a number of unused "no connect" (NC) pins a commonly found on packaged DRAMs. While these unused pins are available to provide additional functionality to a given DRAM device, this feature is typically not taken advantage of.

As discussed briefly above, data in a DRAM is typically accessed on a word by word basis. These words may for example be of 1, 4, 8, 16, 32 or 64 bits in lengths. The accesses themselves may be random, pages, serial or nibbled. The page mode is particularly useful in applications, such as display data processing, where blocks of data are often required at a time. In the page mode, a row address is presented to address port and latched in with RAS to select a given row in the array. A column address is next presented to the address port and latched in CAS to select a first column or group of columns allowing access to a first word along the selected row. Column decode (static or dynamic) circuitry then increments from the received column address to generate a sequence of column addresses to adjacent column or group of columns, thereby allowing access to a "page" of words along the same selected row.

The advantages of using the page mode become apparent in light of the manner in which most data processing systems currently operate. Often, spacial locality and/or temporal locality of data in memory is maintained for efficiency. For example, a central processing unit (CPU) may execute an instruction sequence which mostly operates adjacent blocks of data in memory. In some cases, accesses to and from such "spatially contiguous" blocks may take place during 90% of the execution time. The CPU may also execute loops of instructions and subinstructions which repeatedly operate on the same blocks of data in memory. In this case, "temporal locality" is being maintained. The page mode is preferable in each of these cases since a number of words are accessed during a single RAS random cycle (i.e., per row address).

Presently, DRAM performance in the page mode is limited by page length. The length of a page is determined primarily by the capabilities of the peripheral circuitry and the length of the rows in the cell array. For example, a 16 megabit memory may be organized as "k rows and k columns" (in an actual implementation the array is 4,096 rows by 4,096 columns). The maximum length of any page in this case is therefore k (4,096) bits, irrespective of the number of bits per word accessed per column address ("CAS cycle"). As a result, each time the data for an entire row has been accessed, a complete new RAS cycle must be performed to address the next row. In other words, no more than one row can be paged out at a time before interruption by another "random" cycle (RAS cycle). Significantly, the time required for each RAS cycle is substantially longer than that required to access a page, typically 130 nanoseconds versus 40 nanoseconds for the first page. In other words, the first page after RAS goes active typically requires 70–80 nanoseconds and each subsequent page (CAS cycle) along that row typically requires approximately 40 nanoseconds. Thus, with currently available DRAM, substantial amounts of time a required to access a block of cells spanning multiple rows, and in particular, all the cells in the array.

Thus, the need has arisen for circuits, systems and methods for improving page mode accesses in DRAMs and their derivatives. Such circuits, systems and methods should allow for page mode access of blocks of cells spanning multiple rows and even provide for the page mode access to all the cells in the cell array. In implementing the additional functionality, any necessary control signals generated off-chip should advantageously use the available "NC" connections already available in standard DRAM packaging.

SUMMARY OF THE INVENTION

The principles of the present invention in general provide for the implementation of continuous page accesses in a random access memory device. Specifically, memories, systems and methods according to the present invention allow for the storage locations of multiple rows in a random access memory to be accessed without interruption notwithstanding the time required to perform RAS cycles during row switching. Memories according to the principles of the present invention generally include for an auxiliary memory system associated with the memory cell arrays which maintains the flow of data between the memory device and an external device while each RAS cycle is being performed.

According to a first embodiment of the present invention, a random access memory is provided which includes input/output circuitry, an array of memory cells arranged in rows in columns, and row control circuitry for selecting in response to a row address a given row of cells in the array for access. The random access memory also includes column control circuitry for controlling access to locations along a selected row, each location comprising at least one memory cell. The column control circuitry is operable to sequentially access a first plurality of the locations along the selected row through the input/output circuitry and simultaneously access a second plurality of the locations along the selected row. Auxiliary memory circuitry is provided for interfacing exchanges of data between the second plurality of locations and the input/output circuitry, the auxiliary memory circuitry exchanging data words with corresponding ones of the second plurality of locations of the array in parallel and with the input/output circuitry in serial.

According to another embodiment of the principles of the present invention, a continuous page memory is provided which includes input/output circuitry, an array of rows and columns of random access memory cells, row access control circuitry, auxiliary memory, and location access control circuitry. The row access control circuitry is operable during a row access cycle of a predetermined time interval to latch in a received row address with a row address strobe and select a corresponding row in the array in response. The auxiliary memory is provided for exchanging a sequence of data words with the input/output circuitry during the row access cycle, a number of words in the sequence of data words selected as a function of the row access cycle time interval. The location access control circuitry is included for providing access to storage locations along a selected row, wherein each storage location comprises at least one memory cell. The location access control circuitry is operable during a first selected time period of a data access cycle to allow for page accesses between a first plurality of locations along the selected row and the input/output circuitry. The location access control circuitry is operable during a second selected time period of the data access cycle to allow for the simultaneous exchange of words of data between the auxiliary memory and corresponding ones of a second plurality of locations along the selected row.

According to a further embodiment of the principles of the present invention, a continuous page random access memory is provided which includes an array of rows and columns of random access memory cells. Row access control circuitry is provided which is operable during each of a plurality of row access cycles of a predetermined time interval to latch in a received row address with a row address strobe and select a corresponding row in the array in response. An auxiliary memory is also provided. Read/write circuitry is included for reading and writing data into selected locations in the array during each of a plurality of data access cycles occurring between the row access cycles, each of the locations comprising at least one of the memory cells. The read/write circuitry is operable during a first selected time period of each of the data access cycles to allow for page accesses to a first plurality of the locations along the selected row through the input/output circuitry. The read/write circuitry is further operable during a second selected time period of each of the data access cycles to allow for a parallel exchange of words of data between the auxiliary memory and corresponding ones of a second plurality of locations along the selected row.

The principles of the present invention are also embodied in methods for performing continuous page accesses in a memory system having an array of rows and columns of memory cells, storage cell locations comprising at least one of the memory cells on a given row accessible during a data access cycle and row selecting occurring during a row access cycle. During a first selected time period of each data access cycle, a first plurality of the locations along a selected one of the rows are accessed through a memory system input/output. During a second selected time period of each data access cycle, words of data are exchanged in parallel between an auxiliary memory and corresponding ones of a second plurality of storage locations along the selected row. Finally, during each row access cycle, data ms exchanged between the memory input/output and the auxiliary memory.

The principles of the present invention provide substantial advantages over presently available circuits, systems and methods for implementing page mode accesses in DRAMs and their derivatives. In particular, the principles of the present invention allow for page mode accesses of blocks of cells spanning multiple rows and ultimately, for the page mode access to all of the cells in the cell array as an uninterrupted page. In implementing this additional functionality, any necessary control signals generated off chip advantageously use already available "no connect" pins already available in standard DRAM packaging.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
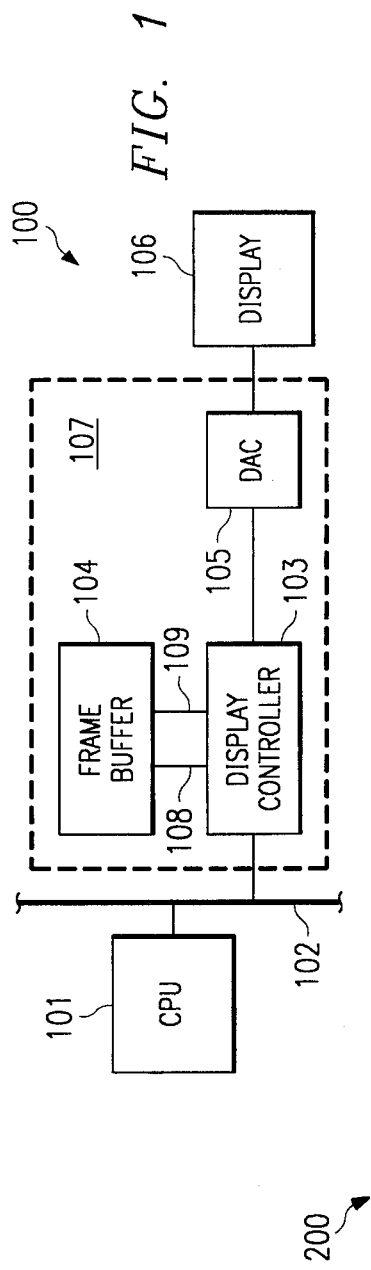
FIG. 1 is a functional block diagram of a display control system.
Figure 2:
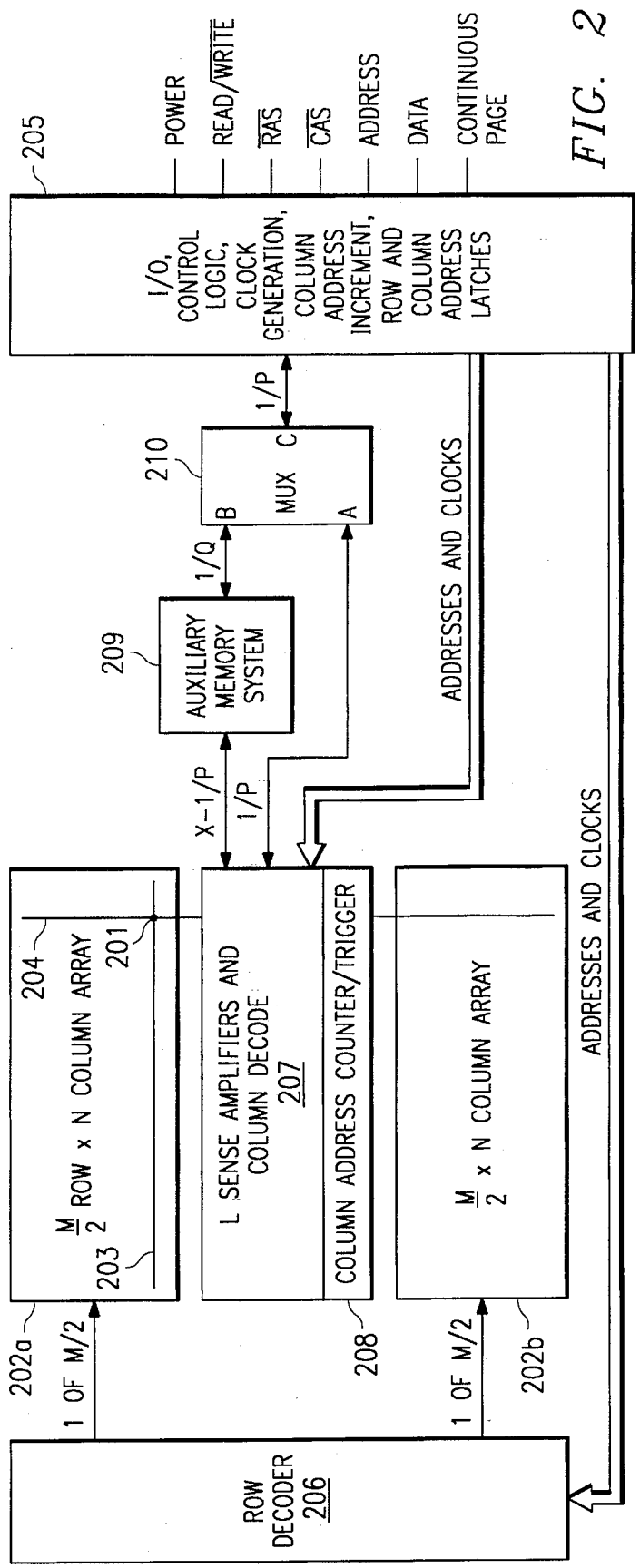
FIG. 2 is a more detailed functional block diagram of a memory device embodying the principles of the present invention, the memory device of FIG. 2 suitable in one application to the construction of the frame buffer of the system of FIG. 1.

The principles of the present invention and their advantages are best understood by referring to the illustrated embodiment depicted in FIGS. 1 and 2 of the drawings, in which like numbers designate like parts. For purposes of illustration, the principles of the present invention will be described as may be implemented in a display system frame buffer constructed with DRAMs. It should be noted however that these principles may be applied to a number of differing memory devices and data processing systems as will become apparent from the discussion below.

FIG. 1 is a high level functional block diagram of the portion of a processing system 100 controlling the display of graphics and/or video data. System 100 includes a central processing unit 101, a system bus 102, a display controller 103, a frame buffer 104, a digital to analog converter (DAC) 105 and a display device 106. Display controller 103, frame buffer 104 and DAC 105 may fabricated together on a single integrated circuit chip 107 or on separate chips.

CPU 101 controls the overall operation of system ("master") 100, determines the content of graphics data to be displayed on display unit 106 under user commands, and performs various data processing functions. CPU 101 may be for example a general purpose microprocessor used in commercial personal computers. CPU 101 communicates with the remainder of system 100 via system bus 102, which may be for example a local bus, an IA bus or a PCI bus. DAC 105 receives digital data from controller 103 and outputs in response the analog data required to drive display 106. Depending on the specific implementation of system 100, DAC 105 may also include a color palette, YUV to RGB format conversion circuitry, and/or x- and y-zooming circuitry, to name a few options.

Display 106 may be for example a CRT unit or liquid crystal display, electroluminescent display (ELD), plasma display (PLD), or other type of display device displays images on a display screen as a plurality of pixels. It should also be noted that in alternate embodiments, "display" 106 may be another type of output device such as a laser printer or similar document view/print appliances.

FIG. 2 is a functional block diagram of a dynamic random access memory (DRAM) 200 embodying the principles of the present invention. In the system illustrated in FIG. 1, DRAM 200 is used to construct frame buffer 104, however, it should be recognized that DRAM 200 is suitable for wide range of applications, and in particular to those applications requiring page mode accesses.

DRAM 200 includes a plurality of storage locations 201 arranged in two arrays 202a and 202b. Each array 202 includes M/2 number of rows and N number of columns of dynamic memory cells 201, with each cell 201 being disposed at the intersection of a row and a column. Each row is associated with at least one conductive row line (wordline) 203 and each column is associated with at least one conductive column line (bitline) 204. A selected cell 201, row line 203 and column line 204 are depicted in FIG. 1 for reference. In an actual implementation, DRAM 200 may have a thousand or more rows and a thousand or more columns. For example, a 2 megabyte (16 megabit) device may be arranged as 4,096 rows and 4,096 columns.

Control circuitry 205 controls the input of addresses, the input and output of data, and the input of power and control signals, such as RAS, CAS and read/write select. Row decoding is controlled by row decoder 206 in response to received row addresses. In the illustrated embodiment, row decoder 206 selects one row line 203 from either array 202a or 202b.

Column decoder/sense amplifier circuitry 207 is coupled to the bitlines 204 of each array 202a–202b. In the illustrated embodiment, circuitry 207 includes L number of sense amplifiers and a column decoder. Preferably one sense amplifier is included for each of the N columns in the arrays 202a and 202b. It should be noted that the sense amplifiers may be multiplexed in alternate embodiments. For example, L may equal N/2 where each sense amplifier is switchable between a pair of bitlines 204.

Column decoding according to the principles of the present invention can be performed in one of two modes. In the first mode, sense amplifier/column decoder circuitry 207 provides access to P number of cells of a corresponding P number of bitlines 204 along a selected wordline 203 per column address (i.e., memory 200 is a "by P" memory in which each location is P number of bits wide where P could be 1, 4, 8, 16, 64, etc.). This first mode is primarily suitable for random and conventional page mode accesses. In the second mode, sense amplifiers/column decode circuitry 207 can also simultaneously provide access to X number of P-bit locations. As will be seen below, this mode is particularly useful for implementing "continuous page mode accesses."

Random accesses are made to a selected P-bit location through row decoder 206 and the column decoder of circuitry 207 in response to a single row address and a single column address on system.

Conventional page mode accesses to adjacent P-bit locations along a selected row are performed using row decoder 206, the column decoder and conventional page mode addressing circuitry within control circuitry 205. During page mode operation, a conventional "RAS cycle" is performed as in the random access described above during which a row address and an initial column address are presented to address port of I/O and control circuitry 205 and latched in with RAS and CAS allowing access to a first location along the selected row during the data access cycle. During the same access cycle column increment (static or dynamic) circuitry within I/O and control circuitry 205 then increments from the received column address to generate a sequence of column addresses to thereby allowing access to a "page" of words along the selected row. When the end of the selected row is reached, another "RAS cycle" is performed during which a new row address and a new initial column address are latched in with RAS and CAS. The disadvantage with a conventional page mode is that only a single row of data can be "paged" out before a new RAS cycle must be performed. As stated above, each RAS cycle requires 120–160 nanoseconds.

According to the principles of the present invention, a continuous page access can performed in which a "page" of P-bit locations from multiple rows in arrays 202 are accessed subject to the delay of only one RAS cycle. In the ultimate case, the entirety (i.e., all rows) of arrays 202a and 202b can be accessed in a continuous page. In the preferred embodiment, continuous page accesses are implemented using column address counter/trigger circuitry 208, auxiliary memory system 209 and multiplexer 210. Counter/trigger 208 which is described further below, is enabled/disabled using a "continuous page" control signal received at the inputs to control circuitry 205. Preferably, this control signal is input though an unused ("nc") pin typically available in conventional memory packages. Auxiliary memory 209 may include for example a static RAM (SRAM), a set of registers, or a first-in-first-out memory, along with the requisite I/O and addressing circuitry, as known in the art.

During a random access or a conventional page mode access, P-bit words are transferred directly between control circuitry 205 and sense amplifiers/column decoders 207 through multiplexer 210. In this case, the coupling is made between the "A" port and the "C" port of multiplexer 210 in the circuit illustrated in FIG. 2.

In general, during a continuous page read, the first Y number of P-bit words from each row are sequentially transferred, as in a conventional page operation, directly from sense amplifiers/decoder circuitry 207 to control circuitry 205. The last X number of P-bit words are transferred from sense amplifiers/column decoders 207 to auxiliary memory 210 simultaneously. These last X words are then paged out of auxiliary memory 209, in whole or in part. In this case the "B" port of multiplexer 210 is coupled to the "C" port.

It should be noted at this point that during a read Q number of bits may be transferred from auxiliary memory 210 to control circuitry 205 while X number of P-bit words are transferred from sense amplifiers/decoders 209 to auxiliary memory 209, where the variable Q is less than or equal to the variable X. In other words, one or more bits for each P-bit word output from arrays 202 may be discarded or masked prior to the transfer of data from auxiliary memory 209 to control circuitry 205.

The number of words X is determined in the preferred embodiment as a function of the time required to perform RAS and CAS cycles. For example, assume that each full RAS/CAS cycle (i.e., "RAS" as described above) requires 150 nanoseconds. Also assume that each subsequent "CAS cycle" (i.e., the time required to address and access each new P-bit location along the row in page mode) requires 25 nanoseconds. For purposes of discussion assume each RAS and CAS cycle are divided into arbitrary time units of 5 nanoseconds; thus, in this example each RAS cycle requires 30 units and each CAS cycle requires 5 units. Therefore, each RAS cycle is equivalent to 6 CAS cycles. The number of words X is then also equal to 6.

During a read operation, column address counter/trigger circuitry 208 tracks the current location of the current row being accessed. This may be accomplished in any one of a number of different ways, for example by simply counting the column addresses being presented by the column address incrementation circuitry of control circuitry 205. In other words, the counter increments with each new CAS cycle. Y number of words are sensed and transferred directly between sense amplifiers/decoders 207 and control circuitry 205, as discussed above. When X number of locations remained to be read along the current row, column address counter/trigger circuitry 208 triggers sense amplifiers/decoders 207 to concurrently couple those locations with auxiliary memory 209. Data can then be simultaneously read from the X number of last locations along the current row simultaneously to auxiliary memory 207. After this exchange, a new RAS cycle can begin.

As the new RAS cycle is being performed, the X number of words now held in auxiliary memory 209 are then paged out from auxiliary memory 209. As discussed above, each word may be truncated as required. The first of these words is paged out in serial with the $Y^{th}$ word of the "conventional" portion of the page read for the current row. In this manner, auxiliary memory 209 maintains the stream of data being paged out until the new RAS cycle is complete and access to the next row is possible, at which time the data stream continues from the new row without interruption. Thus, according to the principles of the present invention, multiple row page reads can be accomplished which are transparent to the outside user.

Continuous page mode writes can also performed according to the present invention. During a write to arrays 202, a RAS/CAS cycle is performed to initiate a page mode access to the locations of a given row. While the RAS/CAS cycle is taking place, X number of P-bit words for X number of locations are written into auxiliary memory 209. When the RAS cycle is complete, the words in auxiliary memory 209 are simultaneously written into the first X locations along the selected row. Then, sense amplifier/column decoder circuitry 207 and multiplexer 210 switch and Y number of P-bit words are directly written sequentially into the selected array 202 as column addresses are generated by the column address incrementation circuitry. Once the end of the row has been reached as determined by counter/trigger circuitry 208, the process repeats and the data for the first X locations in the next row are written into auxiliary memory 209 during the new RAS cycle.

In sum, according to the principles of the present invention long page accesses from multiple rows can be performed without interruption during the RAS cycles. In fact, all the locations of all the rows of the arrays can be accessed as a single interrupted page. Such accesses are particularly useful in such applications as display controllers where blocks of data are typically processed. Further, while DRAMs according to the present invention can be used to construct the frame buffers in display systems operating on either pseudocolor (palletized color) or true color, they are particularly useful in true color systems. Specifically, in true color systems, pixel color data is exchanged with the frame buffer as 24-bit RGB words. The rows of conventional DRAMs however typically consist of a number locations which is a multiple of 8 or 16, but not 24. Therefore, in order to avoid splitting 24-bit words between two rows (and consequently having access to part of the split word delayed by the intervening RAS cycle), only full words are stored at the end of a row. As a result, some locations or cells remain unused in each row. With the present invention this problem is eliminated since data can be accessed as a single page which crosses "row boundaries." Finally, it should be noted that the required pin-outs are already available in standard DRAM packaging.

Although the present invention and its advantages have been described in detail, it should be understood that various changes, substitutions and alterations can be made herein without departing from the spirit and scope of the invention as defined by the appended claims.

What is claimed is:

1. A random access memory comprising:

input/output circuitry;

an array of random access memory cells arranged in rows and columns;

row control circuitry for selecting in response to a row address a said row of cells for access;

column control circuitry for controlling access to locations along said selected row, each said location comprising at least one said memory cell, said column control circuitry operable to:

sequentially access a first plurality of said locations along said selected row through said input/output circuitry; and simultaneously access a second plurality of said locations along said selected row; and auxiliary memory circuitry for interfacing exchanges of data between said second plurality of locations and said input/output circuitry, said auxiliary memory circuitry exchanging data words with corresponding ones of said second plurality of locations of said array in parallel and with said input/output circuitry in serial.

2. The memory of claim 1 wherein said auxiliary memory circuitry is operable to exchange data between said input/output circuitry and said auxiliary memory circuitry during an interval when said row control circuitry is preparing to select a new row in said array.

3. The memory of claim 1 wherein said first plurality of locations are sequentially accessed prior to simultaneous access of said second plurality of locations during a read form said array.

4. The memory of claim 1 wherein said second plurality of locations are simultaneously accessed prior to sequential access of said first plurality of locations during a write from said array.

5. The memory of claim 1 wherein said row control circuitry includes:
   row address input circuitry for receiving and latching-in said row address in response to a row address strobe; and
   a row decoder for activating a wordline associated with said selected row in said array corresponding to said received address.

6. The memory of claim 1 wherein said column control circuitry includes:
   a column decoder/sense amplifier circuitry for activating bitlines associated with each cell of each said location along said selected row;
   page mode circuitry for causing said column decoder/sense amplifier circuitry to sequentially activate said bitlines associated with said cells of said first plurality of locations to thereby provide sequential access to said first plurality of locations;
   trigger circuitry for causing said column decoder to simultaneously activate said bitlines associated with said cells of said second plurality of locations.

7. The memory of claim 6 wherein said page mode circuitry includes address incrementation circuitry for generating a sequence of addresses corresponding for sequentially activating said bitlines.

8. The memory of claim 1 wherein said memory cells comprise dynamic random access memory cells.

9. A continuous page memory comprising:
   input/output circuitry;
   an array of rows and columns of random access memory cells;
   row access control circuitry operable during a row access cycle of a predetermined time interval to latch-in a received row address with a row address strobe and select a corresponding said row in said array in response;
   an auxiliary memory for exchanging a sequence of data words with said input/output circuitry during said row access cycle, a number of said sequence of data words selected as a function of said time interval; and
   location access control circuitry for providing access to storage locations along said selected row, each said storage location comprising at least one said memory cell, said location access control circuitry operable during a data access cycle following said row access cycle to:
      during a first selected time period of said data access cycle allow for page accesses between a first plurality of said locations along said selected row and said input/output circuitry; and
      during a second selected time period of said data access cycle allow for the simultaneous exchange of words of data between said auxiliary memory and corresponding ones of a second plurality of locations along said selected row.

10. The memory of claim 9 wherein said first selected time interval precedes said second time interval during a read from said array.

11. The memory of claim 10 wherein said location access control circuitry is operable during said read to:
    latch-in an initial column address corresponding to an initial one of said first plurality of locations in response to a column address strobe;
    increment from said initial column address to generate a plurality of column addresses to subsequent ones of said first plurality of locations; and
    address said second plurality of locations simultaneously after said last location of said first plurality of locations has been read.

12. The memory of claim 9 wherein said second selected time interval precedes said first selected time interval during a write to said array.

13. The memory of claim 12 wherein said location access control circuitry is operable during said write to:
    latch-in a column address to at least one of said second plurality of locations and in response allow said write to said second plurality of locations with data from said auxiliary memory; and
    increment from a first column address corresponding to a first one of said first plurality of locations to generate addresses to allow sequential access to subsequent ones of said first plurality of locations.

14. The memory of claim 9 wherein said location access control circuitry comprises:
    a column decoder/sense amplifier circuitry for activating bitlines associated with each cell of each said location along said selected row;
    page mode circuitry for causing said column decoder/sense amplifier circuitry to sequentially activate said bitlines associated with said cells of said plurality of first plurality of locations to thereby provide sequential access to said first plurality of locations;
    trigger circuitry for causing said column decoder to simultaneously activate said bitlines associated with said cells of said second plurality of locations.

15. The memory of claim 9 wherein said first plurality of locations and said second plurality of locations are adjacently disposed on said selected row.

16. A continuous page random access memory comprising:
   an array of rows and columns of random access memory cells;
   row access control circuitry operable during a each of a plurality of row access cycles of a predetermined time interval to latch-in a received row address with a row address strobe and select a corresponding said row in said array in response;
   an auxiliary memory; and
   read/write control circuitry for reading and writing data into selected locations in said array during each of a plurality of data access cycles occurring between said row access cycles, each said location comprising at least one said memory cell, said read/write control circuitry operable to:
      during a first selected time period of each said data access cycle allow for page accesses to a first plurality of said locations along said selected row through said input/output circuitry; and during a second selected time period of each said data access cycle allow for a parallel exchange of words of data between said auxiliary memory and corresponding ones of a second plurality of locations along said selected row.

17. The memory of claim 16 wherein said first selected time period precedes said second selected time period in said active cycle during a read operation.

18. The memory of claim 16 wherein said second selected time period precedes said second selected time period in said active period during a write operation.

19. The memory of claim 16 wherein said auxiliary memory control circuitry implements a serial exchange of data between said auxiliary memory and said input/output circuitry to maintain a continuous page access during each said row access cycle.

20. A method of performing continuous page accesses in a memory system having an array of rows and columns of memory cells, storage locations comprising at least one of the memory cells on a given row accessible during a data access cycle and row selecting occurring during a row access cycle, the method comprising the steps of:

during a first selected time period of each data access cycle accessing a first plurality of the locations along a selected one of the rows through a memory system input/output;

during a second selected time period of each data access cycle exchanging words of data in parallel between an auxiliary memory and corresponding ones of a second plurality of the storage locations along the selected row; and during each row access cycle, exchanging data between the memory input/output and the auxiliary memory.

21. The method of claim 20 wherein said step of exchanging data between the memory input/output and the auxiliary memory comprises the step of exchanging serial words of data.

* * * * *